(12) United States Patent
Schmidt et al.

(10) Patent No.: US 8,159,126 B2
(45) Date of Patent: Apr. 17, 2012

(54) LIGHT EMITTING DEVICE WITH AN IMPROVED CAALSIN LIGHT CONVERTING MATERIAL

(75) Inventors: Peter J. Schmidt, Aachen (DE); Joerg Meyer, Aachen (DE); Walter Mayr, Alsdorf (DE); Wolfgang Busselt, Roetgen (DE); Hans-Helmut Bechtel, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 893 days.

(21) Appl. No.: 12/092,745

(22) PCT Filed: Oct. 26, 2006

(86) PCT No.: PCT/IB2006/053969
§ 371 (c)(1),
(2), (4) Date: May 6, 2008

(87) PCT Pub. No.: WO2007/052200
PCT Pub. Date: May 10, 2007

(65) Prior Publication Data
US 2008/0290785 A1    Nov. 27, 2008

(30) Foreign Application Priority Data
Nov. 7, 2005    (EP) .................... 05110432

(51) Int. Cl.
| H01J 1/62 | (2006.01) |
| H01J 63/04 | (2006.01) |
| C09K 11/08 | (2006.01) |
| C09K 11/66 | (2006.01) |
| C09K 11/02 | (2006.01) |
| C09K 11/77 | (2006.01) |

(52) U.S. Cl. ............ 313/503; 252/301.4 R; 252/301.4 F

(58) Field of Classification Search .................. 313/498, 313/502, 503; 252/301.4 F, 301.4 R
See application file for complete search history.

(56) References Cited

U.S. PATENT DOCUMENTS

| 7,938,983 B2 * | 5/2011 | Mueller-Mach et al. .. 252/301.4 F |
| 2002/0043926 A1 | 4/2002 | Takahashi et al. |
| 2004/0104672 A1 | 6/2004 | Shiang et al. |
| 2004/0145308 A1 | 7/2004 | Rossner et al. |
| 2005/0029927 A1 | 2/2005 | Setlur et al. |
| 2005/0117361 A1 | 6/2005 | Takeda et al. |
| 2007/0007494 A1 * | 1/2007 | Hirosaki et al. ....... 252/301.4 R |
| 2010/0133563 A1 * | 6/2010 | Schmidt et al. ................ 257/98 |

FOREIGN PATENT DOCUMENTS

| EP | 1568753 A2 | 8/2005 |
| JP | 2002033521 A | 1/2002 |
| JP | 2005008794 A | 1/2005 |
| WO | WO2005/052087 | * 9/2005 |
| WO | WO2005090517 A1 | 9/2005 |
| WO | WO2006095285 A1 | 9/2006 |

OTHER PUBLICATIONS

Hintzen et al: "Evidence for the Presence of Eu2+ in (Y,Eu)-Si-Al-O-N Glass by Luminescence Spectroscopy"; Journal of Materials Science, Kluwer Academic Publishers, vol. 39, No. 6, Mar. 1, 2004, pp. 2237-2238.

* cited by examiner

*Primary Examiner* — Carol M Koslow
*Assistant Examiner* — Matthew Hoban
(74) *Attorney, Agent, or Firm* — Mark Beloborodov; Dicran Halajian

(57) ABSTRACT

A light emitting device with a light source to emit primary light and a light conversion layer to convert at least a part of the primary light into secondary light includes a CaAlSiN light converting material with a transmissivity of $\geq 10\%$ to $\leq 80\%$ for a light in the wavelength range from $\geq 580$ to $\leq 1000$ nm.

10 Claims, 1 Drawing Sheet

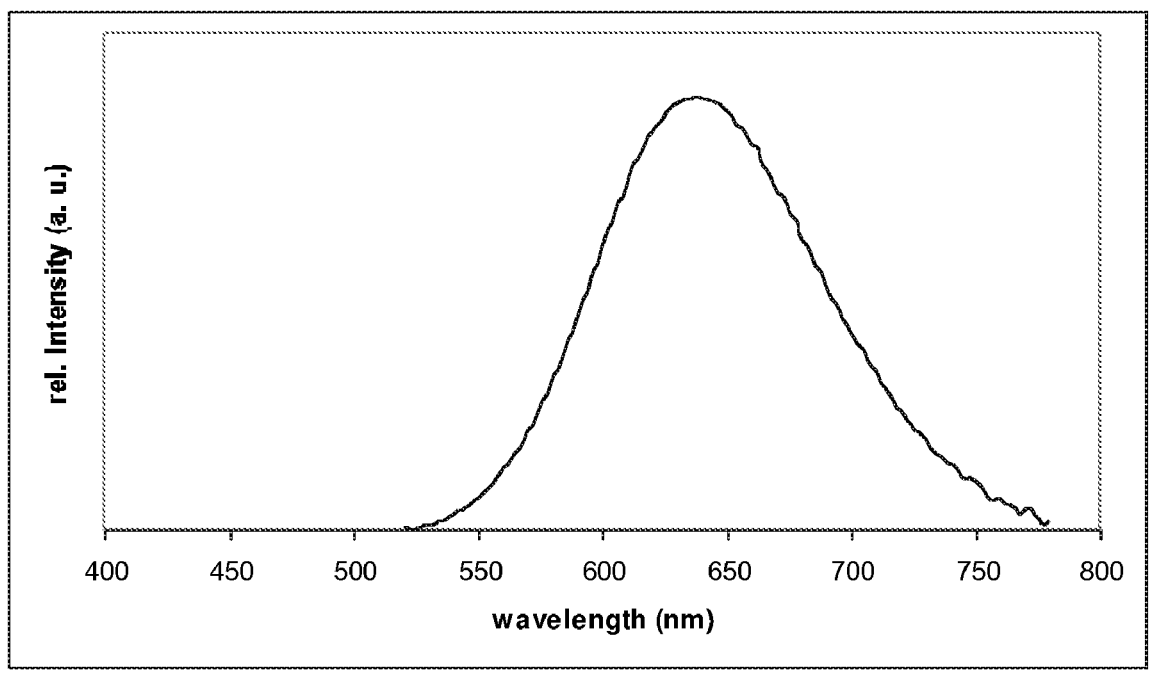

LIGHT EMITTING DEVICE WITH AN IMPROVED CAALSIN LIGHT CONVERTING MATERIAL

The present invention is directed to light emitting devices, especially to the field of LEDs.

So-called phosphor converted light emitting devices comprising an electroluminescent light source and a light converting element to absorb light emitted from the light source at least partially and to re-emit secondary light with longer wavelengths are known from prior art. In recent times, the scope of LEDs comprising a CaAlSiN light converting phosphor material has been investigated and in this regard it has been found that such a material can be used in LEDs. An example is e.g. described in the EP05101834.9 which is incorporated by reference.

However, although the phosphor material described in this document shows good optical characteristics, the demands for LEDs, especially LEDs for use in cars require in most applications higher effectivity and temperature-stability.

It is an object of the present invention to provide a light-emitting device which comprises a CaAlSiN light converting material with improved effectivity and temperature stability.

This object is solved by a light-emitting device with a light source to emit primary light and a light conversion layer to convert at least a part of the primary light into secondary light comprising a CaAlSiN light converting material with a transmissivity of $\geq 10\%$ to $\leq 80\%$ for a light in the wavelength range from $\geq 580$ to $\leq 1000$ nm. Accordingly, a light emitting device, especially a LED is provided, comprising a CaAlSiN light converting material with a transmissivity of $\geq 10\%$ to $\leq 80\%$ for light in the wavelength area from $\geq 580$ to $\leq 1000$ nm. The light source may be one or more light sources from the group inorganic LEDs, organic LEDs or laser diodes.

The term "CaAlSiN light converting material" comprises and/or includes especially the following materials:

$(Ca_{1-x-y-z}Sr_xBa_yMg_z)_{1-n}Al_{1-a+b}B_aSi_{1-b}N_{3-b}O_b:M_n$ with $0 \leq x,y,z \leq 1$, $0 \leq a \leq 1$, $0 \leq b < 1$, $0 \leq n \leq 1$ and M being a metal, according to an embodiment of the present invention selected out of the group comprising Ce, Pr, Nd, Sm, Eu, Gd, Tb, Dy, Ho, Er, Tm, Yb, Lu or mixtures thereof as well as a mixture of these materials with additives which may be added during ceramic processing. These additives may be incorporated fully or in part into the final material, which then may also be a composite of several chemically different species (CaAlSiN crystallites embedded into a glassy matrix of slightly different composition) and particularly include such species known to the art as fluxes. Suitable fluxes include alkaline earth—or alkaline—metal oxides and fluorides, $SiO_2$ and the like.

The term "transmissivity" in the sense of the present invention means especially that $\geq 10\%$, according to an embodiment of the present invention $\geq 20\%$, according to an embodiment of the present invention $\geq 30\%$, according to an embodiment of the present invention $\geq 40\%$ and $\leq 80\%$ of the incident light of a wavelength, which cannot be absorbed by the material, is transmitted through the sample for normal incidence in air. This wavelength is according to an embodiment of the present invention, in the range of $\geq 580$ nm and $\leq 1000$ nm.

When using such a CaAlSiN light converting material, the features of the light-emitting device may in most applications be greatly improved (as will for some applications be described later on).

According to an embodiment of the present invention, the CaAlSiN light converting material emits secondary light in the red visible light wavelength area with a maximum intensity at a wavelength of $\geq 590$ nm to $\leq 700$ nm. This allows building up a light emitting device with improved characteristics. According to an embodiment of the present invention, the CaAlSiN light converting material has an emission band in the red visible light wavelength area with a maximum of $\geq 600$ nm to $\leq 680$ nm, or according to an another embodiment of the present invention, an emission band with a maximum of $\geq 620$ nm to $\leq 670$ nm.

According to an embodiment of the present invention, the CaAlSiN light converting material emits secondary light with a wavelength distribution with a half-width of $\geq 50$ nm to $\leq 150$ nm. This results in a sharp emission, which allows to further improve the light emitting device. According to an embodiment of the present invention, the CaAlSiN light converting material emits secondary light with a wavelength distribution with a half-width of $\geq 60$ nm to $\leq 110$ nm.

According to an embodiment of the present invention, the CaAlSiN light converting material has $\geq 97\%$ to $\leq 100\%$ of the theoretical single crystal density. By doing so, the CaAlSiN light converting material shows greatly improved mechanical and optical characteristics compared to materials with a lesser density. According to an embodiment of the present invention, the CaAlSiN light converting material has $\geq 98\%$ to $\leq 100\%$ of the theoretical single crystal density, according to an embodiment of the present invention $\geq 99\%$ to $\leq 100\%$ of the theoretical single crystal.

According to an embodiment of the present invention, the CaAlSiN light converting material is a polycrystalline material.

The term "polycrystalline material" in the sense of the present invention means especially a material with a volume density larger than 90 percent of the main constituent, consisting of more than 80 percent of single crystal domains, with each domain being larger than 0.5 μm in diameter and having different crystallographic orientations. The single crystal domains may be connected by amorphous or glassy material or by additional crystalline constituents.

According to an embodiment of the present invention, the CaAlSiN converting material is a ceramic material.

The term "ceramic material" in the sense of the present invention means especially a crystalline or polycrystalline compact material or composite material with a controlled amount of pores or which is free of pores.

According to an embodiment of the present invention the thickness of the ceramic material D is 30 μm$\leq$D$\leq$5000 μm, according to an embodiment of the present invention 60 μm$\leq$D$\leq$2000 μm and according to an embodiment of the present invention 80 μm$\leq$D$\leq$1000 μm.

According to an embodiment of the present invention, the shift of the maximum and/or the half-width of the secondary light emission in the red visible light wavelength area of the CaAlSiN light converting material is $\leq 20$ nm over the whole temperature range from $\geq 550°$ C. to $\leq 150°$ C. By doing so, the light emitting device will show a constant behaviour during performance e.g. when used in a car.

According to an embodiment of the present invention, the shift of the maximum and/or the half-width in the emission band in the red visible light wavelength area of the CaAlSiN light converting material is $\geq 0$ nm to $\leq 20$ nm over the whole temperature range from $\geq 0°$ C. to $\leq 200°$ C., and according to an embodiment of the present invention, from $\geq -40°$ C. to $\leq 250°$ C.

According to an embodiment of the present invention, the shift of the maximum and/or the half-width in the secondary light emission in the red visible light wavelength area of the CaAlSiN light converting material is $\geq 5$ nm to $\leq 18$ nm over the whole temperature range from $\geq 50°$ C. to $\leq 150°$ C., According to an embodiment of the present invention, $\geq 0°$ C. to $\leq 200°$ C., and According to an embodiment of the present invention, from $\geq -40°$ C. to $\leq 250°$ C. According to an embodiment of the present invention, the shift of the maximum and/or the half-width in the secondary light emission in the red visible light wavelength area of the CaAlSiN light converting material is $\geq 10$ nm to $\leq 15$ nm over the whole temperature range from $\geq 50°$ C. to $\leq 150°$ C., According to an embodiment of the present invention, $\geq 0°$ C. to $\leq 200°$ C., and According to an embodiment of the present invention, from $\geq -40°$ C. to $\leq 250°$ C.

According to an embodiment of the present invention, the CaAlSiN light converting material is selected out of a material comprising $(Ca_{1-x-y-z}Sr_xBa_yMg_z)_{1-n}Al_{1-a+b}B_aSi_{1-b}N_{3-b}O_b:Re_n$, with $0 \leq x,y,z \leq 1$, $0 \leq a \leq 1$, $0 \leq b < 1$, $0 \leq n \leq 1$ and RE selected out of the group comprising Eu, Ce, or mixtures thereof.

According to an embodiment of the present invention, the CaAlSiN light converting material is selected out of a material comprising $(Ca_{1-x-y-z}Sr_xBa_yMg_z)_{1-n}Al_{1-a+b}B_aSi_{1-b}N_{3-b}O_b:M_n$, with $0 \leq x,y,z \leq 1$, $0 \leq a \leq 1$, $0 \leq b < 1$, $0.002 \leq n \leq 0.2$ and M being a metal, according to an embodiment of the present invention selected out of the group comprising Ce, Pr, Nd, Sm, Eu, Gd, Tb, Dy, Ho, Er, Tm, Yb, Lu or mixtures thereof.

According to an embodiment of the present invention, the CaAlSiN light converting material is selected out of a material comprising $(Ca_{1-x-y-z}Sr_xBa_yMg_z)_{1-n}Al_{1-a+b}B_aSi_{1-b}N_{3-b}O_b:M_n$, with $0 \leq x,y,z \leq 1$, $0 \leq a \leq 1$, $0 \leq b < 1$, $0.002 \leq n \leq 0.2$ and RE selected out of the group comprising Eu, Ce, or mixtures thereof.

According to an embodiment of the present invention, the CaAlSiN light converting material is selected out of a material comprising $((Ca_{1-x-y-z}Sr_xBa_yMg_z)_{1-0.5*k*n}RE^{k+}{}_n)_{1-a}(Al_{1-m}B_m)_bSi_{2-b}N_{3-o}O_o$ with $0 \leq x,y,z \leq 1$, $0 \leq m \leq 1$, $0.002 \leq n \leq 0.2$, $b < o+1$, $a = 0.5(1-o+b)$, $0 \leq o \leq 1$, $k=2$ or 3 and RE selected out of the group comprising Eu, Ce, or mixtures thereof.

According to an embodiment of the present invention, the CaAlSiN light converting material is selected out of a material comprising $((Ca_{1-x-y-z}Sr_xBa_yMg_z)_{1-0.5*k*n}RE^{k+}{}_n)_{1-a}(Al_{1-m}B_m)_bSi_{2-b}N_{3-o}O_o$ with $0 \leq x,y,z \leq 1$, $0 \leq m \leq 1$, $0.002 \leq n \leq 0.2$, $b < o+1$, $a = 0.5(1-o+b)$, RE selected out of the group comprising Eu, Ce, or mixtures thereof, with $0 \leq o \leq 0.15$; according to another preferred embodiment $0 \leq o \leq 0.01$, according to a third preferred embodiment $0 \leq o \leq 0.02$.

According to an embodiment of the present invention, the CaAlSiN light converting material is selected out of a material comprising $((Ca_{1-x-y-z}Sr_xBa_yMg_z)_{1-0.5*k*n}RE^{k+}{}_n)_{1-a}(Al_{1-m}B_m)_bSi_{2-b}N_{3-o}O_o$ with $0 \leq x,y,z \leq 1$, $0 \leq m \leq 1$, $0.002 \leq n \leq 0.2$, $b < o+1$, $a = 0.5(1-o+b)$, RE selected out of the group comprising Eu, Ce, or mixtures thereof, with $0 \leq o \leq 0.15$; according to another preferred embodiment $0.01 \leq o \leq 0.15$, according to a third preferred embodiment $0.02 \leq o \leq 0.1$.

According to an embodiment of the present invention, the glass phase ratio of the CaAlSiN light converting material is $\geq 2$ vol % to $\leq 5$ vol %, according to an embodiment of the present invention, $\geq 3$ vol % to $\leq 4$ vol %. It has been shown in practice that materials with such a glass phase ratio show the improved characteristics, which are advantageous and desired for the present invention. The term "vol %" denotes the volume fraction given in percentage.

The term "glass phase" in the sense of the present invention means especially non-crystalline grain boundary phases, which may be detected by scanning electron microscopy or transmission electron microscopy.

According to a preferred embodiment of the present invention, the surface roughness RMS (disruption of the planarity of a surface; measured as the geometric mean of the difference between highest and deepest surface features) of the surface(s) of the CaAlSiN light converting material is $\geq 0.001$ μm and $\leq 100$ μm. According to an embodiment of the present invention, the surface roughness of the surface(s) of the CaAlSiN light converting material is $\geq 0.01$ μm and $\leq 10$ μm, according to an embodiment of the present invention $\geq 0.01$ μm and $\leq 5$ μm, according to an embodiment of the present invention $\geq 0.15$ μm and $\leq 5$ μm. and according to an embodiment of the present invention $\geq 0.2$ μm and $\leq 2$ μm.

According to a preferred embodiment of the present invention, the specific surface area of the CaAlSiN light converting material structure is $\geq 10^{-7}$ m²/g and $\leq 1$ m²/g.

The present invention furthermore relates to a method of producing a CaAlSiN light converting material for a light-emitting device according to the present invention comprising a sintering step.

The term "sintering step" in the sense of the present invention means especially densification of a precursor powder under the influence of heat, which may be combined with the application of uniaxial or isostatic pressure, without reaching the liquid state of the main constituents of the sintered material.

According to an embodiment of the present invention, the sintering step is performed at ambient pressure, preferably in reducing or inert atmosphere.

According to an embodiment of the present invention, method furthermore comprises the step of pressing the CaAlSiN precursor material to $\geq 50\%$ to $\leq 70\%$, according to an embodiment of the present invention, $\geq 55\%$ to $\leq 60\%$ of its theoretical single crystal density before sintering. It has been shown in practice that this improves the sintering steps for most CaAlSiN light converting materials as described with the present invention.

According to an embodiment of the present invention, the method of producing CaAlSiN light converting material for a light-emitting device according to the present invention comprises the following steps:

(a) Mixing the precursor materials for the CaAlSiN light converting material (b) optional firing of the precursor materials, preferably at a temperature of $\geq 1300°$ C. to $\leq 1800°$ C. to remove volatile materials (such as $CO_2$ in case carbonates are used)

(c) optional grinding and washing (d) a first pressing step, preferably a uniaxial pressing step at $\geq 10$ kN using a suitable powder compacting tool with a mould in the desired shape (e.g. rod- or pellet-shape) and/or a cold isostatic pressing step preferably at $\geq 3000$ bar to $\leq 3500$ bar (e) a sintering step at $\geq 1500°$ C. to $\leq 2200°$ C. at ambient pressure (f) a hot pressing step, preferably a hot isostatic pressing step preferably at $\geq 1100$ bar to $\leq 2500$ bar and preferably at a temperature of $\geq 1500°$ C. to $\leq 2000°$ C. and/or a hot uniaxial pressing step preferably at $\geq 100$ bar to $\leq 2500$ bar and preferably at a temperature of $\geq 1500°$ C. to $\leq 2000°$ C.

(g) optionally a post annealing step at $>1000°$ C. to $<1700°$ C. in inert atmosphere or air According to an embodiment of the present invention, the light-emitting device comprises a light emitting diode (LED), according to an embodiment of the present invention a LED based on AlInGaN material as the electroluminescent material.

According to an embodiment of the present invention, the light-emitting device comprises a first light converting material, according to an embodiment of the present invention a ceramic first light converting material, and a second light converting material.

According to an embodiment of the present invention, this second light converting comprises a YAG:Ce material. These materials have proven themselves in practice to be suitable for many applications within the present invention.

According to an embodiment of the present invention, the light emitting device has a color temperature of $\geq 3000K$ to $\leq 5000K$, according to an embodiment of the present invention 3500K to $\leq 4000K$.

The present invention also includes a method of preparing a light-emitting device according to the present invention comprising the steps of:

(a) Providing at least a LED comprising a CaAlSiN first light converting material and at least a second luminescent color converter as described above
(b) measuring the color temperature of the light emitting device
(c) adjusting the color temperature of the light emitting device whereby the steps (b) and (c) may be repeated ad libitum.

This method allows for most applications to define the color temperature of the light emitting device as desired and for most applications also to adjust the color temperature of the light-emitting device even after production.

According to an embodiment of the present invention, step c) is performed by abrasion of either the CalAlSiN material and/or the second luminescence color converter material.

According to an embodiment of the present invention, step c) is performed by changing the ratio of the amount of CaAlSiN light converting material and the second light converting material.

According to an embodiment of the present invention, this is performed by using plates or stripes of the CaAlSiN light converting material and the second luminescent color converter material, which are arranged laterally on the light emitting area of the LED chip. The color adjustment is performed by changing the ratio of plates or stripes of the CaAlSiN light converting material towards the plates or stripes of the second light converting material.

According to an embodiment of the present invention, color adjustment is performed by using several prefabricated LED chips which comprise certain different ratios of the CaAlSiN light converting material and second luminescent color converter material or comprise only one of the two materials, so that the adjustment may be performed by changing the brightness of the different LED chips in the light emitting device, or the amount of LED chips of a certain type. The first option will result in a color tunable device.

Additionally the color temperature may be set by changing the doping level in either the CaAlSiN light converting material and the second luminescent color converter material or changing the host lattice of either the CaAlSiN light converting material and the second light converting material (e.g. by adding Ga, Gd or Lu in case of a YAG material and/or adding Sr, Ba, Mg or O in case of the CaAlSiN light converting material). These measures may be used alone or in combination with the methods stated above.

A light emitting device according to the present invention as well as a CaAlSiN light converting material as produced with the present method may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the sub-claims, the FIGURE and the following description of the respective FIGURES and examples, which—in an exemplary fashion—show an embodiment of a CaAlSiN light converting material for use in a light emitting device according to the invention.

FIG. 1 shows an emission spectra of an LED comprising a CaAlSiN light converting material according to Example I of the present invention

EXAMPLE I

FIG. 1 refers to $(Ca_{0.95}Sr_{0.05})_{0.98}AlSiN_3:Eu_{0.02}$ (Example I) which was produced as follows:

$(Ca_{0.95}Sr_{0.05})_{0.98}AlSiN_3:Eu_{0.02}$ was synthesized from 6.894 g $Ca_3N_2$ (Alfa Aesar, Karlsruhe, Germany), 710 mg $SrN_2$ (Cerac, Milwaukee, Wis., USA), 6.148 g AlN (Nanoamor, Los Alamos, N. Mex., USA), amorphous 7.364 g SiN (Alfa Aesar) and 627 mg $EuF_3$ (Aldrich, Taufkirchen, Germany). The powders were mixed in a porcelain mortar, filled into Molybdenum crucibles and fired for 4 h at 1450° C. in forming gas atmosphere. The resulting red powder was washed with acetic acid, water and 2-propanol to remove by-products and finer particles.

The obtained powder was compressed into pellets, cold isostatically pressed at 3200 bar and sintered at 1700° C. in forming gas atmosphere for 4 h. The resulting pellets displayed a closed porosity and were subsequently hot isostatically pressed at 2000 bar and 1700° C. to obtain dense ceramics with >98% of the theoretical density.

The thus produced $(Ca_{0.95}Sr_{0.05})_{0.98}AlSiN_3:Eu_{0.02}$ was incorporated into a light emitting device in form of a luminescence converting layer (638 nm peak wavelength, 200 µm $(Ca_{0.93}Sr_{0.05}Eu_{0.02})AlSiN_3$ plate) using AlInGaN as an electroluminescent material having a wavelength of 450 nm.

FIG. 1 shows an emission spectra of this LED. The Color point is: x=0.615, y=0.384

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A light emitting device comprising:
a light source to emit primary light; and
a light conversion layer to convert at least a part of the primary light into secondary light comprising a CaAlSiN light converting material with a transmissivity of $\geq 10\%$ to $\leq 80\%$ for a light in the wavelength range from $\geq 580$ to $\leq 1000$ nm, wherein the CaAlSiN light converting material is selected out of a material comprising $(Ca_{1-x-y-z}Sr_xBa_yMg_z)_{1-n}Al_{1-a+b}B_aSi_{1-b}N_{3-b}O_b:M_n$ with $0<x,y,z\leq 1$, $0<a\leq 1$, $0<b<1$, $0.002\leq n\leq 0.2$, M being a metal comprising at least one of Gd and Lu.

2. The light emitting device of claim 1, whereby the CaAlSiN light converting material emits secondary light in the red visible light wavelength range with a maximum intensity at a wavelength of $\geq 590$ nm to $\leq 700$ nm.

3. The light emitting device of claim 1, whereby the CaAlSiN light converting material emits secondary light with a wavelength distribution with a half-width of $\geq 50$ nm to $\leq 150$ nm.

4. The light emitting device of claim 1 whereby the CaAlSiN light converting material has a density of $\geq 97\%$ to $\leq 100\%$ of the theoretical single crystal density.

5. The light emitting device of claim 1 whereby the shift of the maximum and/or the half-width in the secondary light emission in the red visible light wavelength range of the CaAlSiN light converting material is 20 nm over the whole temperature range from $\geq 50°$ C. to $\leq 50°$ C.

6. The light emitting device of claim 1 whereby the glass phase ratio of the CaAlSiN light converting material is $\geq 2$ vol % to $\leq 5$ vol %.

7. A method of producing a CaAlSiN light converting material for a light emitting device comprising the acts of:
mixing powders of precursor material; and
heating the mixed powders to obtain a resulting powder comprising the CaAlSiN light converting material, wherein the CaAlSiN light converting material is selected out of a material comprising $(Ca_{1-x-y-z}Sr_xBa_yMg_z)_{1-n}Al_{1-a+b}B_aSi_{1-b}N_{3-b}O_b:M_n$ with $0<x,y,z\leq 1$, $0<a\leq 1$, $0<b<1$, $0.002\leq n\leq 0.2$, M being a metal comprising at least one of Gd and Lu.

8. The method of claim 7, further comprising the act of compressing the resulting powder into pellets by pressing at 3200 bar and sintering at 1700° C.

9. The method of claim 7, further comprising the act of, subsequent to the compressing act, further compressing the pellets by pressing at 2000 bar and sintering at 1700° C.

10. The method of claim 7, further comprising the act of compressing the resulting powder into pellets.

\* \* \* \* \*